United States Patent [19]

Kikuchi

[11] Patent Number: 5,923,199
[45] Date of Patent: Jul. 13, 1999

[54] DELAY CIRCUIT FOR GIVING DELAYS OF VARIABLE WIDTH

[75] Inventor: Makoto Kikuchi, Tokyo, Japan

[73] Assignee: Ando Electric Co., Ltd., Tokyo, Japan

[21] Appl. No.: 08/769,726

[22] Filed: Dec. 18, 1996

[30]     Foreign Application Priority Data

Dec. 26, 1995 [JP] Japan ..................................... 7-351609

[51] Int. Cl.$^6$ .................................................. H03K 5/13
[52] U.S. Cl. ........................... 327/269; 327/270; 327/285
[58] Field of Search ................................... 327/269, 270, 327/271, 272, 276–278, 285, 261, 262, 293, 295, 296

[56]                 References Cited

U.S. PATENT DOCUMENTS

| 5,204,564 | 4/1993 | Ochiai ..................................... 327/269 |
| 5,216,302 | 6/1993 | Tanizawa ................................. 327/277 |
| 5,489,867 | 2/1996 | Tamanoi ................................. 327/270 |

FOREIGN PATENT DOCUMENTS 6-45889  2/1994  Japan ..................................... 327/261

*Primary Examiner*—Timothy P. Callahan
*Assistant Examiner*—Eunja Shin

*Attorney, Agent, or Firm*—Flynn, Thiel, Boutell & Tanis, P.C.

[57]                 ABSTRACT

A scale of circuit is reduced when a plurality of variable delay circuits are provided with respect to the same signal. A variable delay circuit is constructed such that variable delay circuit elements each comprising a delay circuit element composed of buffer gates each having an identical amount of delay connected in series and a selector e for selecting the input and output of the delay circuit element are connected in series in n−1 stages, wherein the number of the delay elements of the delay circuit element in each variable delay circuit element is $2^{i-1}$ (i: number of stages) in the order from the final stage. Other variable delay circuits are constructed such that the delay circuit element in the first stage of variable delay circuit elements in the one first stage of variable delay circuit elements of the one variable delay circuit is shared by the other variable delay circuits, and selectors for selecting the input and output of the delay circuit element and stages of variable delay circuit elements each comprising the delay circuit element composed of the delay elements connected in series and the selector for selecting the input and output of the delay circuit element are connected in series, wherein the number of the delay elements of the delay circuit element in each variable delay circuit element is $2^{i-1}$ (i: number of stages) in the order from the final stage.

7 Claims, 4 Drawing Sheets

FIG.3

| SELECTOR TERMINAL SIGNAL | | | | | | AMOUNT OF DELAY |
|---|---|---|---|---|---|---|
| S61 | S51 | S41 | S31 | S21 | S11 | |
| L | L | L | L | L | L | 0 ns |
| L | L | L | L | L | H | 100 PS |
| L | L | L | L | H | L | 200 PS |
| L | L | L | L | H | H | 300 PS |
| ⁓ | ⁓ | ⁓ | ⁓ | ⁓ | ⁓ | ⁓ |
| H | H | H | H | H | L | 6.2 ns |
| H | H | H | H | H | H | 6.3 ns |

DELAY CIRCUIT FOR GIVING DELAYS OF VARIABLE WIDTH

BACKGROUND OF THE INVENTION

1. Field of the Invention

The present invention relates to a delay circuit in which a plurality of variable delay circuits for giving delays of variable width $x \times 2^n$ with variable step x are provided in parallel and each of the variable delay circuits receives one input signal to produce optional delay to each outputs.

2. Prior Art

A conventional delay circuit is generally constructed as shown in FIG. 4. In FIG. 4, denoted by $g_1$ through $g_m$ are variable delay circuits which receive one input signal A in parallel. These variable delay circuits $g_1$ through $g_m$ have the same construction and comprise delay circuit elements $a_{11}$ through $a_{1m}$ for a delay x, delay circuit elements $a_{21}$ through $a_{2m}$ for a delay $x \times 2^1$, delay circuit elements $a_{31}$ through $a_{3m}$ for a delay $x \times 2^2$, ..., and delay elements $a_{n1}$ through $a_{nm}$ for a delay $x \times 2^{n-1}$. An input and an output of each delay can be optionally selected by selectors SELs $e_{11}$ through $e_{nm}$, and each selected output is supplied in series.

That is, the delay circuit elements $a_{11}$ through $a_{1m}$ for the delay x can delay the input signal by the variable step x, the delay circuit elements $a_{21}$ through $a_{2m}$ for the delay $x \times 2^1$ can delay the input signal by the variable step $x \times 2^1$, the delay circuit elements delays $a_{31}$ through $a_{3m}$ for the delay $x \times 2^2$ can delay the input signal by the variable step $x \times 2^2$, and the delay circuit elements $a_{n1}$ through $a_{nm}$ for the delay $x \times 2^{n-1}$ can delay the input signal by the variable step $x \times 2^{n-1}$.

The variable delay circuit $g^1$ realizes a variable delay circuit giving delays of variable width $x \times 2^n$ with variable step x by determining whether it selects or does not select a delay x by the SEL $e_{11}$, a delay $x \times 2^1$ by the SEL $e_{21}$, a delay $x \times 2^2$ by the SEL $e_{31}$, ..., and a delay $x \times 2^{n-1}$ by the SEL $e_{n1}$. Likewise, the variable delay circuits $g_2$ through $g_m$ have respectively the circuits equivalent to the variable delay circuit $g_1$, and it can determine the delay of the equivalent variable width with the equivalent variable step.

As mentioned above, each of the delay circuit elements has been conventionally controlled to be selected with respect to the variable delay circuits $g_1$ through $g_m$ so that m delay signals A-1 through A-m are produced wherein they are respectively varied in the delay from the input signal A. However, in the conventional circuit arrangement, there is a drawback that each variable delay circuit is large-scaled to increase the variable width. There is another drawback that variable delay circuits are required by a number obtained by multiplying the number of delay signals to be produced to increase the number of delay signals to be produced, leading to large-scaling of each variable delay circuit.

As mentioned in detail above, there are drawbacks in the conventional delay circuit that each scale of the variable delay circuits is enlarged in proportion to the variable width to increase the variable width, and the variable delay circuits are required by a number to increase obtained by multiplying a number of signals to be produced and the number of delay signals to be produced, which leads to large-scaling of each variable circuit.

SUMMARY OF THE INVENTION

The present invention has been made to solve the aforementioned drawbacks of the conventional delay circuit and it is an object of the present invention to provide a delay circuit capable of increasing the variable width and the number of delay signals while restraining the scale of each circuit to be enlarged to the minimum.

To achieve the above object, the delay circuit of the present invention comprises a plurality of variable delay circuits $f_1$ through $f_m$ giving delays of variable width $x \times 2^n$ (n: integer of 0 or more) with variable step x provided in parallel and the variable delay circuits each receiving one input signal A to produce optional delays to each outputs, wherein a delay circuit element $a_{n1}$ for a delay $x \times 2^{n-1}$ that has a maximum delay in one variable delay circuit $f_1$ of the plurality of variable delay circuits $f_1$ through $f_m$ is shared by the other variable delay circuits $f_2$ through $f_m$.

More in detail, one variable delay circuit $f_1$ of the aforementioned plural variable delay circuits $f_1$ through $f_m$ is constructed such that variable delay circuit elements each comprising a delay circuit element a composed of one or more delay elements i each having an identical amount of delay x connected in series and a selector e for selecting the input and output of the delay circuit element a are connected in series in n–1 stages, wherein the number of the delay circuit element a in each variable delay circuit element is $2^{i-1}$ (i: number of stages) in the order from the final stage, and other variable delay circuits $f_2$ through $f_m$ are constructed such that the delay circuit element $a_{n1}$ in the first stage of variable delay circuit element $a_{n1}$ in the one first stage of variable delay circuit elements of the one variable delay circuit $f_1$ is shared by the other variable delay circuits $f_2$ through $f_m$, and selectors $e_{n2}$ through $e_{nm}$ for selecting the input and output of the delay circuit element $a_{n1}$ and n–2 stages of variable delay circuit elements each comprising the delay circuit element a composed of the delay elements i connected in series and the selector e for selecting the input and output of the delay circuit element a are connected in series, wherein the number of the delay elements of the delay circuit element a in each variable delay circuit element is $2^{i-1}$ (i: number of stages) in the order from the final stage.

Buffer gates can be used for the delay elements i.

The delay circuit elements $a_{n1}$ for the delay $x \times 2^{n-1}$ in the first stage of the variable delay circuit $f_1$ occupies about a half of the scale of entire circuits of the delay circuit elements $a_{11}, a_{21}, a_{31}, \ldots, a_{n1}$ of the variable delay circuit $f_1$. The variable delay circuits $f_2$ through $f_m$ share the delay circuit element $a_{n1}$ for the delay $x \times 2^{n-1}$ of the variable delay circuit $f_1$. As a result, the scale of the circuits of the delay circuit element portions of the other variable delay circuits $f_2$ through $f_m$ is reduced to about a half thereof, thereby restraining the enlargement of the scale of the circuits.

BRIEF DESCRIPTION OF THE DRAWINGS

FIG. 3 is a view showing a variable step and a variable width in each of variable delay circuits of the preferred embodiment of the present invention.

PREFERRED EMBODIMENT OF THE INVENTION

A delay circuit according to a preferred embodiment will be now described with reference to FIGS. 1 through 3.

Figure 1:
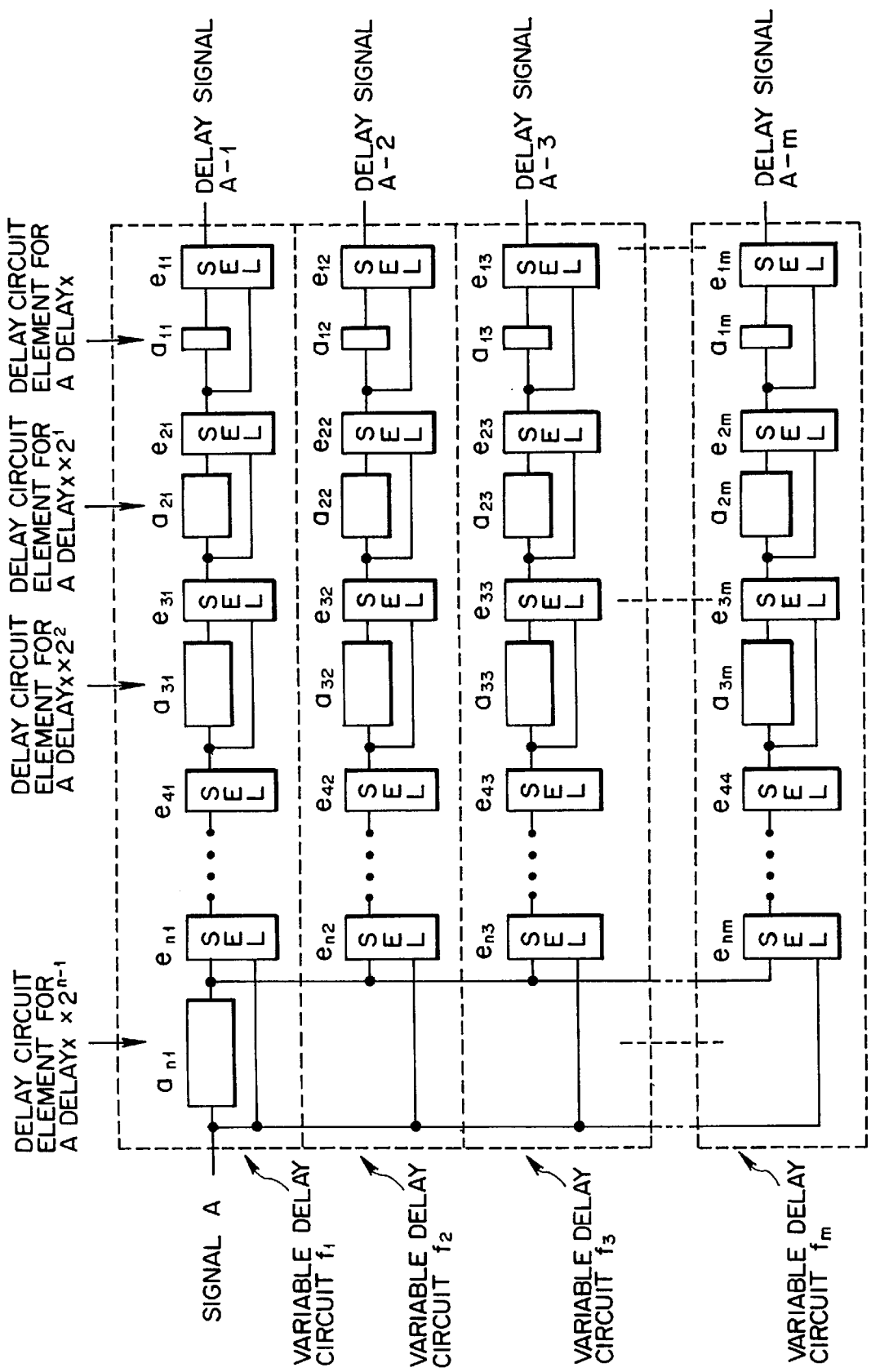
FIG. 1 is a block diagram of a circuit arrangement of a delay circuit according to a preferred embodiment of the present invention.

In FIG. 1, denoted by $f_1$ through $f_m$ are variable delay circuits. One input signal A is supplied to the variable delay circuit $f_1$. The variable delay circuit $f_1$ comprises delay circuit elements $a_{11}$ through $a_{n1}$, and selectors SELs $e_{11}$ through $e_{n1}$ for optionally selecting inputs and outputs of each of the delay circuit elements all through $a_{n1}$, wherein each of the outputs selected by the selector SELs $e_{11}$ through $e_{n1}$ can be supplied in series in the order inverse to the numerals of such SELs $e_{11}$ through $e_{n1}$.

The input and output signals of the delay circuit element $a_{n1}$ in the first stage of the variable delay circuit $f_1$ are supplied respectively to the other variable delay circuits $f_2$ through $f_m$. That is, each of the variable delay circuits $f_2$ through $f_m$ has the same construction as the variable delay circuit $f_1$ except the delay circuit element $a_{n1}$, and the variable delay circuits $f_2$ through $f_m$ comprise delay circuit elements $a_{12}$ through $a_{1m}$ for a delay x, delay circuit elements $a_{22}$ through $a_{2m}$ for a delay $x \times 2^1$, delay circuit elements $a_{32}$ through $a_{3m}$ for a delay $x \times 2^2$, .... The variable delay circuits $f_2$ through $f_m$ further comprise selectors SELs $e_{12}$ through $e_{nm}$ capable of optionally selecting the input and output of each of the delay circuit elements $a_{12}$ through $a_{3m}$, ..., and those of the delay circuit element $a_{n1}$ in the first stage of the variable delay circuit $f_1$, wherein selected outputs thereof are supplied in series in the order inverse to the numerals thereof.

In the variable delay circuits $f_1$ through $f_m$ having the aforementioned arrangements, the delay circuit element $a_{n1}$ has the delay $x \times 2^{n-1}$, the delay circuit elements $a_{31}$ through $a_{3m}$ has the delay $x \times 2^2$, the delay circuit elements $a_{21}$ through $a_{2m}$ has the delay $x \times 2^1$, and the delay circuit elements $a_{11}$ through $a_{1m}$ has the delay x. The delay element circuit element $a_{n1}$ for the delay $x \times 2^{n-1}$ can delay the input signal by the delay $x \times 2^{n-1}$, the delay circuit elements $a_{31}$ through $a_{3m}$ for the delay $x \times 2^2$ can delay the input signal by the delay $x \times 2^2$, the delay circuit elements $a_{21}$ through $a_{2m}$ for the delay $x \times x \ 2^1$ can delay the input signal by the delay $\times 2^1$, and the delay circuit elements delays $a_{11}$ through $a_{1m}$ for the delay x can delay the input signal by the delay x.

The variable delay circuit $f_1$ realizes the variable delay circuit giving delays of variable width $x \times 2^2$ with variable step x by determining whether it selects or does not select the delay $x \times 2^{n-1}$ by the SEL $e_{n1}$, and likewise by determining whether it selects or does not select the delay $x \times 2^2$ by the SEL $e_{31}$, the delay $x \times 2^1$ by the SEL $e_{21}$ and the delay x by the SEL $e_{11}$.

The variable delay circuit $f_2$ shares the delay circuit element $a_{n1}$ for the delay $x \times 2^{n-1}$ of the variable delay circuit $f_1$ and realizes the variable delay circuit giving delays of the same variable width with the same variable step as those of the variable delay circuit $f_1$, by determining whether it selects or does not select the delay $x \times 2^{n-1}$ by the selector SEL $e_{n2}$, and likewise by determining whether it selects or does not select the delay $x \times 2^2$ by the SEL $e_{32}$, the delay $x \times 2^1$ by the SEL $e_{22}$, and the delay x by the SEL $e_{12}$.

Likewise, the variable delay circuit $f_3$ through $f_m$ share the delay circuit element $a_{n1}$ for the delay $x \times 2^{n-1}$ of the variable delay circuit $f_1$, like the variable delay circuit $f_2$ and realizes the variable delay circuit giving delays of the same variable width with the same variable step as those of the variable delay circuit $f_1$.

With the delay circuit having the aforementioned arrangement, m delay signals A-1 through A-m, which are respectively varied from the signal A in the delay, can be produced by selectively controlling each of the selectors SEL $e_{11}$ through $e_{nm}$ of the variable delay circuits $f_1$ through $f_m$.

In this case, the delay circuit element $a_{n1}$ for the delay $x \times 2^{n-1}$ of the variable delay circuit $f_1$ occupies about a half of the scale of the entire circuits of the delay circuit elements $a_{11}, a_{21}, a_{31}, \ldots$ of the variable delay circuit $f_1$. Accordingly, when the variable delay circuits $f_2$ through $f_m$ share the delay circuit element $a_{n1}$ for the delay $x \times 2^{n-1}$ of the variable delay circuit $f_1$, the scale of the delay circuit element portions of the variable delay circuit $f_2$ through $f_m$ becomes about a half of the conventional ones, leading to the effect of miniaturization, a low power consumption and a low cost.

Figure 2:
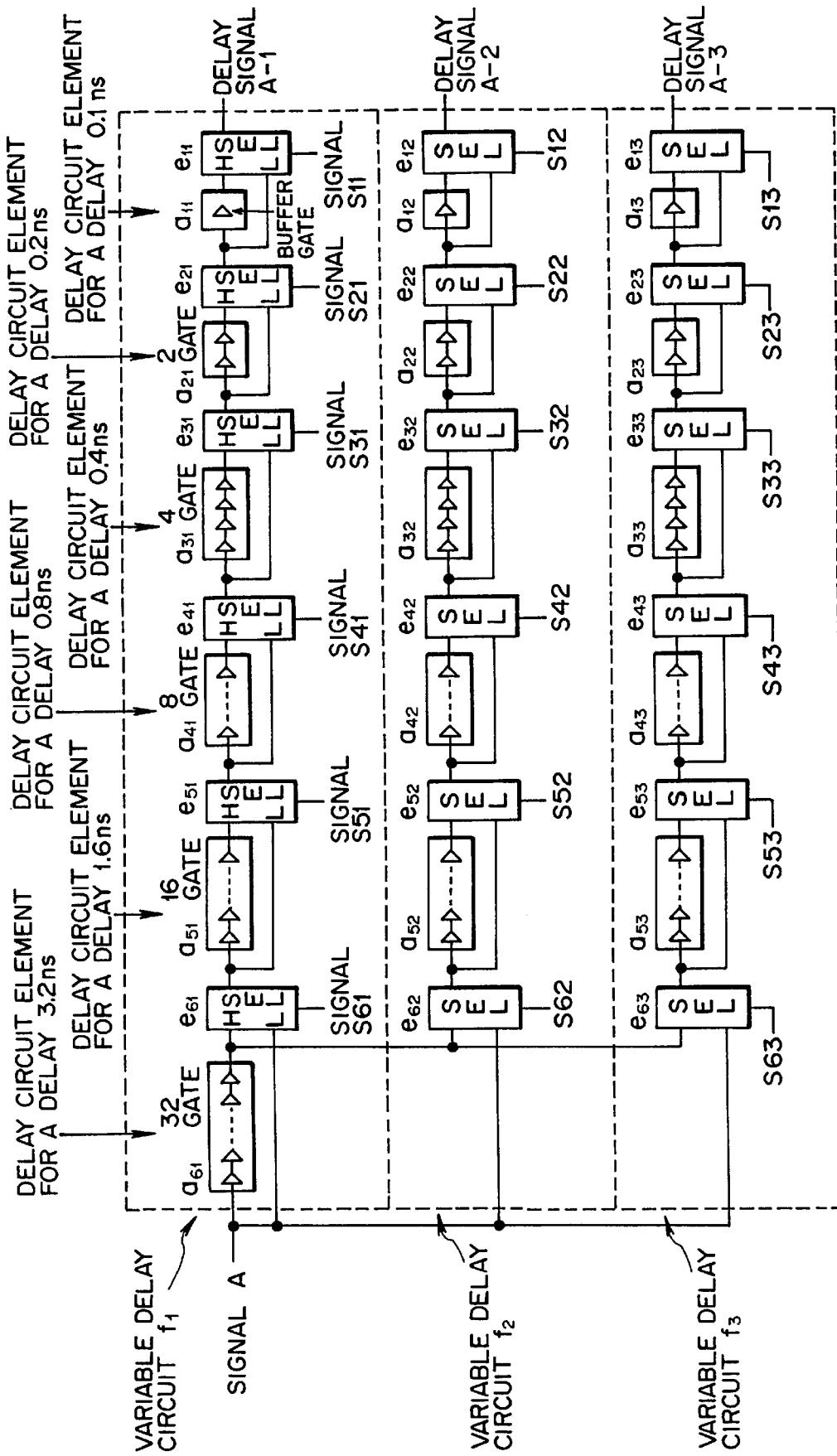
FIG. 2 is another block diagram showing a detailed circuit arrangement of the delay circuit in FIG. 1.
Figure 4:
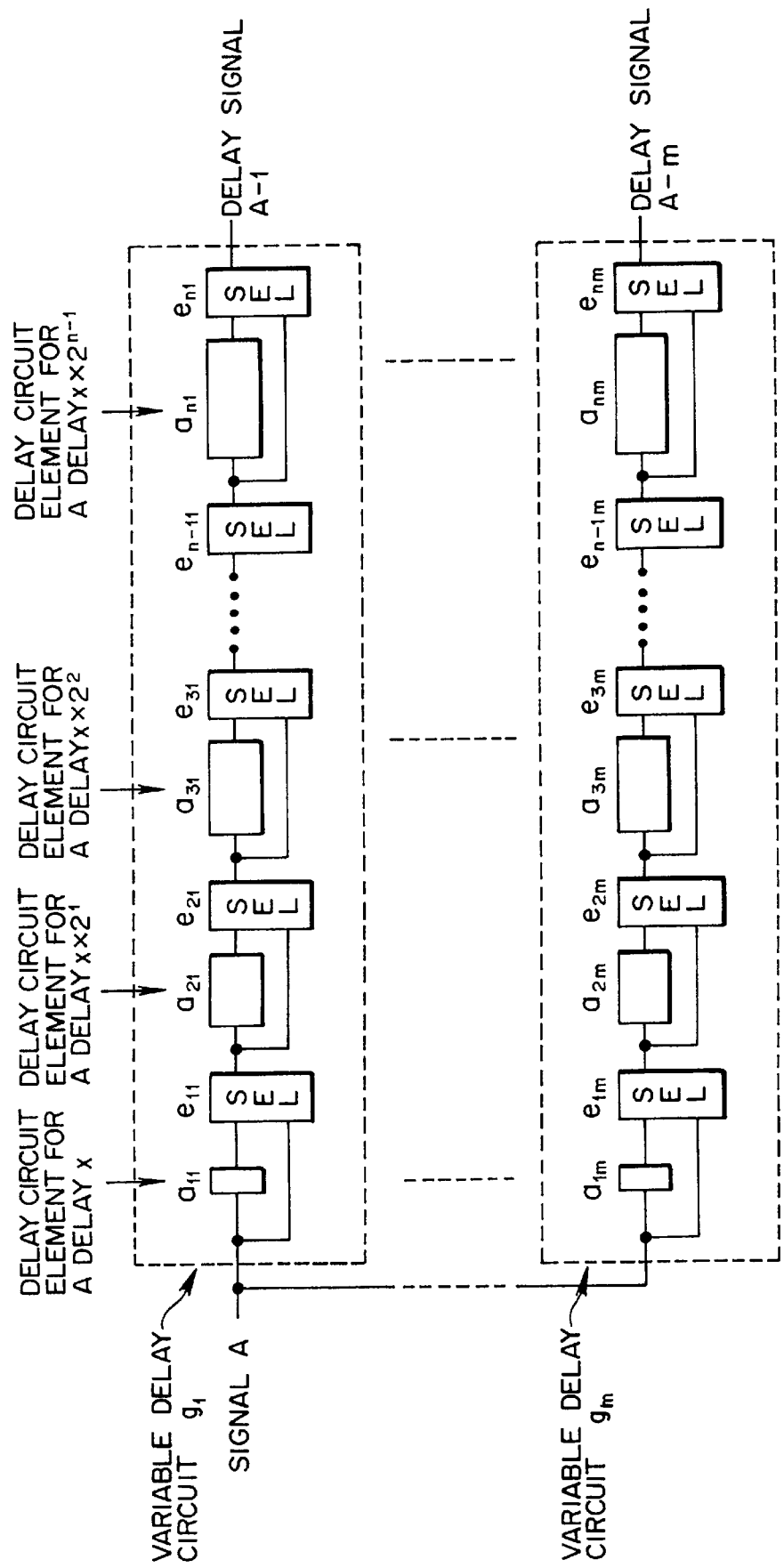
FIG. 4 is a block diagram of a circuit arrangement of a conventional delay circuit.

FIG. 2 shows a concrete delay circuit of FIG. 1 showing a case where n=6 and m=3 are established. The delay circuit element $a_{n1}$ in the first stage of each of the variable delay circuits $f_1$ through $f_m$ comprises 32 buffer gates i for a delay of x=100 ps which are connected in series, and the second delay circuit elements $a_{51}$ through $a_{53}$ in the second stage comprise 16 buffer gates i which are connected in series. Likewise, the delay circuit elements $a_{41}$ through a43 in the third stage comprise 8 buffer gates i which are connected in series, and the delay circuit elements $a_{31}$ through $a_{33}$ in the fourth stage comprise 4 buffer gates i which are connected in series. Likewise, the delay circuit elements $a_{21}$ through $a_{23}$ in the fifth stage comprise 2 buffer gates i which are connected in series, and the delay circuit elements $a_{11}$ through $a_{13}$ in the sixth stage comprise only 1 buffer gate i.

Since the delay of the buffer gates i is 100 ps, each delay of each stage of variable delay circuits is sequentially 3.2 ns, 1.6 ns, 0.8 ns, 0.4 ns, 0.2 ns, 0.1 ns.

With the circuit arrangement set forth above, the variable delay circuit $f_1$ can selectively control a delay circuit element for the delay 3.2 ns by the SEL $e_{61}$, a delay circuit element for the delay 1.6 ns by the SEL $e_{51}$, a delay circuit element for the delay 0.8 ns by the SEL $e_{41}$, a delay circuit element for the delay 0.4 ns by the SEL $e_{31}$, a delay circuit element for the delay 0.2 ns by the SEL $e_{21}$, a delay circuit element for the delay 0.1 ns by the SEL $e_{11}$, in response to the signals $S_{11}, S_{21}, S_{31}, \ldots S_{61}$. As a result, the variable delay circuit for giving delays of the variable width 6.3 ns with the variable step 100 ps is realized as shown in FIG. 3.

The variable delay circuits $f_2$ and $f_3$ share the delay circuit element $b_{61}$ for the delay 3.2 ns of the variable delay circuit $f_1$.

That is, the variable delay circuit $f_2$ can selectively control the delay circuit element for the delay 3.2 ns by the SEL $e_{62}$, the delay circuit element for the delay 1.6 ns by the SEL $e_{52}$, the delay circuit element for the delay 0.8 ns by the SEL $e_{42}$, the delay circuit element for the delay 0.4 ns by the SEL $e_{32}$, the delay circuit element for the delay 0.2 ns by the SEL $e_{22}$, the delay circuit element for the delay 0.1 ns by the SEL $e_{12}$, in response to the signals $S_{12}, S_{22}, S_{32}, \ldots S_{62}$. As a result, the variable delay circuit for giving delays of the variable width 6.3 ns with the variable step 100 ps is realized like the variable delay circuit $f_1$.

The variable delay circuit $f_3$ can selectively control the the delay circuit element for the delay 3.2 ns by the SEL $e_{63}$, the delay circuit element for the delay 1.6 ns by the SEL $e_{53}$, the delay circuit element for the delay 0.8 ns by the SEL $e_{43}$, the delay circuit element for the delay 0.4 ns by the SEL $e_{33}$, the delay circuit element for the delay 0.2 ns by the SEL $e_{23}$, the delay circuit element for the delay 0.1 ns by the SEL $e_{13}$, in response to the signals $S_{12}, S_{22}, S_{32}, \ldots S_{62}$. As a result, the variable delay circuit for giving delays of the variable width 6.3 ns with the variable step 100 ps is realized like the variable delay circuit $f_1$.

The delay circuit elements $a_{61}$ for the delay 100 ps$\times 2^5$ of the variable delay circuit $f_1$ occupies about a half of the scale of entire circuits of the delay circuit elements $a_{11}, a_{21}, a_{31}, \ldots a_{61}$ of the variable delay circuit $f_1$. Since the variable delay circuits $f_2$ through $f_m$ share the delay circuit element $a_{61}$ for the delay 100 ps×$2^5$ of the variable delay circuit $f_1$, the scale of the circuits of the delay circuit element portions of the variable delay circuits $f_2$ through $f_m$ is reduced to about a half thereof, leading to the effect of miniaturization, a low power consumption and a low cost.

According to the invention, the delay circuit element $a_{n1}$ for the delay x×$2^{n-1}$ of the variable delay circuit $f_1$ occupies about a half of the scale of the entire circuits of the delay circuit elements $a_{11}$, $a_{21}$, $a_{31}$, ... of the variable delay circuit $f_1$. Accordingly, when the variable delay circuits $f_2$ through $f_m$ share the delay circuit element $a_{n1}$ for the delay x×$2^{n-1}$ of the variable delay circuit $f_1$, the scale of the delay circuit element portions of the variable delay circuit $f_2$ through $f_m$ becomes about a half of the conventional ones, leading to the effect of miniaturization, a low power consumption and a low cost.

What is claimed is:

1. A delay circuit arrangement comprising a plurality of variable delay circuits giving delays of variable width x×$2^n$ (n: integer of 0 or more) with variable step x provided in parallel and said variable delay circuits each receiving one input signal to produce optional delays to each respective output, wherein one delay circuit element for a delay x×$2^{n-1}$ that has a maximum delay in one variable delay circuit of said plurality of variable delay circuits is shared by said other variable delay circuits.

2. A delay circuit arrangement according to claim 1, wherein:

one variable delay circuit of said plurality of variable delay circuits is constructed of a plurality of delay circuit elements including said one delay circuit element, each said delay circuit element comprising one or more delay elements each having an identical amount of delay x connected in series and selectors for selecting the input and output of said delay circuit elements, said delay circuit elements being connected in series in n−1 stages, wherein the number of said delay elements of said delay circuit element in each said variable delay circuit is $2^{i-1}$ (i: number of stages) in order from a final stage elements of said one varible delay circuit is shared by said other variable delay circuits, and selectors for selecting the input and output of said one delay circuit element and n−2 stages of said delay circuit elements each comprising a delay circuit element composed of selay elements connected in series and said selector for selecting the input and output of said delay circuit element are connected in series, wherein the number of said delay elements of each delay circuit element is $2^{i-1}$(i: number of stages).

3. A delay circuit arrangement according to claim 2, wherein buffer gates are used for said delay elements.

4. A delay circuit arrangement according to claim 2 wherein each said selector enables variation in time delay for respective said delay circuit elements.

5. A delay circuit arrangement comprising a plurality of variable delay circuits giving delays of variable width, each of said plurality of variable delay circuits receiving one input signal to produce optional delays to a respective output signal, a first said variable delay to a comprising a plurality of delay circuit elements, other said variable delay circuits comprising another plurality of delay circuit elements, one of said delay circuit elements from said first variable delay circuit being shared by said other variable delay circuits wherein said shared delay circuit element has a maximum delay with respect to said other delay circuit elements.

6. A delay circuit arrangement according to claim 5 wherein said plurality of variable delay circuits give delays of variable width x×$2^n$ (n: integer of 0 or more) with variable step x provided in parallel, said shared delay circuit element having a delay of x×$2^{n-1}$.

7. A delay circuit according to claim 5 wherein said delay circuit elements are composed of delay elements, said delay elements comprising buffer gates.

\* \* \* \* \*

UNITED STATES PATENT AND TRADEMARK OFFICE
CERTIFICATE OF CORRECTION

PATENT NO. : 5 923 199
DATED : July 13, 1999
INVENTOR(S) : Makoto KIKUCHI

It is certified that error appears in the above-identified patent and that said Letters Patent is hereby corrected as shown below:

Column 6, line 3; change "stage elements of said one variable" to ---stage.---.
Column 6, lines 4-12; delete in their entirety.
Column 6, line 22; change "to a" to ---circuit---.

Signed and Sealed this

Thirtieth Day of November, 1999

Q. TODD DICKINSON

Attest:

Attesting Officer

Acting Commissioner of Patents and Trademarks